(12) United States Patent
Haub

(10) Patent No.: US 7,711,341 B2
(45) Date of Patent: May 4, 2010

(54) MULTIMODE RECEIVER CONTROL METHOD AND APPARATUS

(75) Inventor: David Ryan Haub, San Diego, CA (US)

(73) Assignee: Spreadtrum Communications Inc., George Town, Grand Cayman (KY)

( * ) Notice: Subject to any disclaimer, the term of this patent is extended or adjusted under 35 U.S.C. 154(b) by 878 days.

(21) Appl. No.: 11/421,207

(22) Filed: May 31, 2006

(65) Prior Publication Data

US 2007/0281653 A1     Dec. 6, 2007

(51) Int. Cl.
  H04B 1/10    (2006.01)
  H04B 17/00   (2006.01)
(52) U.S. Cl. .................. 455/296; 455/132; 455/226.2
(58) Field of Classification Search ............. 455/226.1, 455/232.1, 63.1, 67.13, 132, 135, 136, 161.1, 455/184.1, 150.1, 200.1, 226.2, 226.3, 227, 455/286, 269
See application file for complete search history.

(56) References Cited

U.S. PATENT DOCUMENTS

| | | | |
|---|---|---|---|
| 5,303,400 A * | 4/1994 | Mogi | 455/186.1 |
| 5,465,410 A | 11/1995 | Hiben et al. | |
| 5,493,717 A | 2/1996 | Schwarz | |
| 5,898,928 A * | 4/1999 | Karlsson et al. | 455/450 |
| 5,949,832 A * | 9/1999 | Liebetreu et al. | 375/344 |
| 6,961,552 B2 * | 11/2005 | Darabi et al. | 455/241.1 |
| 6,999,742 B2 * | 2/2006 | Fang | 455/266 |
| 2004/0029537 A1 * | 2/2004 | Pugel et al. | 455/115.1 |
| 2006/0148433 A1 * | 7/2006 | Welnick et al. | 455/140 |

OTHER PUBLICATIONS

W-CDMA Superheterodyne Reference Design: V1.0 RF Transceiver Description, Maxim Application Note 1211.
Reynolds, et al.; A Direct-Conversion Receiver Integrated Circuit for WCDMA Mobile Systems; IBM J. Res. & Dev., vol. 47, No. 2/3, Mar./May 2003.

* cited by examiner

Primary Examiner—Blane J Jackson

(57) ABSTRACT

Various embodiments of the present invention adjust an operating mode of a configurable receiver based at least in part on a selected communication service to be provided and an available signal quality. A control unit receives data related to one or more selected communication services to be provided. The control unit also receives information about the environmental operating conditions in which the configurable receiver is operating, via one or more signal quality metrics. The control unit adjusts the operating mode of the configurable receiver by modifying the gain of a received signal, the channel bandwidth, or controlling the synthesizers or equalizers.

3 Claims, 8 Drawing Sheets

MULTIMODE RECEIVER CONTROL METHOD AND APPARATUS

FIELD OF THE INVENTION

The present invention relates to wireless communications in general and, in particular, to a configurable wireless receiver.

BACKGROUND OF THE INVENTION

Traditionally, users wishing to receive different wireless services (e.g., voice, pager, wireless email, etc.) would purchase and use different devices. However, there is a trend toward having a single communication device capable of receiving each of these communication services. Often, the different services are provided using the same protocol. A single device for receiving different communication services may be configured to receive any of the different services on the same set of receive paths in a single receiver chain. Conventional practice, therefore, is to design a radio transceiver targeted to support multimode services. In typical CDMA transceivers, for example, voice communications and data services are supported by a single receiver chain.

While operating requirements for the different services may vary, traditional receivers have often provided limited flexibility to adapt to the varying requirements. For example, channel bandwidth and amplification requirements can differ depending on whether the user is using the device for voice or high-speed data. This multiple use configuration may, for example, unnecessarily drain power from a device. Also, high-speed data operational requirements are different than voice, and an inflexible configuration designed to support both may have certain limitations when supporting high-data speeds.

Therefore, while it is desirable to provide a radio transceiver system that can be used for more than one type of communication service, supporting multiple communication services in a single receiver chain creates additional issues and design effects that need to be addressed. Different communication services operate at different bandwidths and communication rates. In addition, the available signal quality can vary significantly, and can impose very different receiver requirements. There is, therefore, a need for a flexible receiver architecture that can be dynamically reconfigured depending on the communication service to be provided and the environmental operating conditions.

BRIEF SUMMARY OF THE INVENTION

Various embodiments of the present invention modify an operating mode of a configurable receiver based at least in part on a selected communication service to be provided and an available signal quality. Generally, a control receives data related to one or more selected communication services to be provided, and further receives information about the environmental operating conditions in which the configurable receiver is operating, via one or more signal quality metrics. The operating mode of the configurable receiver is adjusted by modifying the gain of a received signal, the channel bandwidth, or controlling the synthesizers or equalizers.

Some embodiments comprise methods of dynamically controlling signal processing in a configurable receiver. In one embodiment, the gain of a received signal is controlled based at least in part on the communication service to be provided and an assessment of available signal quality. The channel bandwidth for the received signal is also modified based on the communication service and the available signal quality. There may be additional changes to the mode of the configurable receiver. A synthesizer or equalizer in the configurable receiver may be controlled based on the communication service and available signal quality, as well. The corner frequency for a high-pass filter configured to filter the received signal may be adjusted on that basis, as well.

The amplification of the received signal may be controlled before or after it is mixed. Moreover, the amplification of the mixed signal may be controlled before or after it is filtered through a high-pass filter. The amplifiers may comprise low noise amplifiers, post mixer amplifiers, variable gain amplifiers, or any combination thereof.

The communication service to be provided may, for example, be voice, low-speed data, high-speed data, or video. Likewise, there are a number of signal quality metrics that may be used to determine the environmental operating conditions applicable to the configurable receiver. For example, a signal to noise ratio or a bit-error rate may be measured or otherwise received, and used in assessing the signal quality. Channel interference may be assessed based on a scan of adjacent channels, and this assessment may comprise a signal quality metric.

In one embodiment, an apparatus is described for dynamically controlling signal processing in a configurable receiver. In this embodiment, a control unit receives a first input identifying a communication service to be provided, and a second input comprising a signal quality metric attributable to the configurable receiver. The control unit also processes the first and second input to produce an output to modify an operating mode for the configurable receiver, the output based at least in part on the first and second input.

The control unit may be coupled with a configurable receiver. The configurable receiver may include an amplifier, a tunable channel filter, a synthesizer, an equalizer, a high-pass filter, or any combination thereof. Each may be individually controlled by the output, or they may be configured to be controlled in a concerted manner. The configurable receiver may include a mode control unit to receive an output from the control unit, and modify the configuration of the configurable receiver based on the output. The configurable receiver may include the control unit or they may be discrete components. The control unit may comprise a digital baseband processor coupled with the configurable receiver.

In one embodiment, the apparatus includes a second receiver configured to scan adjacent channels to produce adjacent channel data. The modification to the operating mode is further based on the adjacent channel data. In another embodiment, a second receiver is configured to receive location based data identifying the location of the configurable receiver. The modification to the operating mode, in this embodiment, is further based on the location based data.

Another set of embodiments comprises a method of dynamically controlling a configurable receiver. A communication service to be provided for a signal received by a receiver is identified, and data representative of environmental operating conditions affecting the reception of the signal is assessed. A modification to the mode of the configurable receiver is controlled, based at least in part on the identified communication service and the environmental operating conditions. The operating mode for the configurable receiver may be selected from a plurality of operating modes. Each operating mode of the plurality may comprise a different configuration of the configurable receiver, each configuration applicable to one or more selected communication services in a selected set of environmental operating conditions.

In another embodiment, an apparatus is described for similarly controlling a configurable receiver. The apparatus includes a control unit configured to identify a communication service to be provided by the configurable receiver, and assess data representative of environmental operating conditions affecting the reception of the signal. The control unit controls a modification to the configuration of the receiver based at least in part on the identified communication service and the environmental operating conditions.

The environmental operating conditions may include a signal to noise ratio, a bit-error rate, location based data, data comprising information from a scan of adjacent channels, or any combination thereof. The control unit may also control a modification to a configuration of a second configurable receiver, based at least in part on an identified communication service to be provided via the second receiver.

BRIEF DESCRIPTION OF THE DRAWINGS

A further understanding of the nature and advantages of the present invention may be realized by reference to the following drawings. In the appended figures, similar components or features may have the same reference label. Further, various components of the same type may be distinguished by following the reference label (e.g., a number) by a second label (e.g., a letter) that distinguishes among the similar components. If only the first reference label is used in the specification, the description is applicable to any one of the similar components having the same first reference label irrespective of the second reference label.

DETAILED DESCRIPTION OF THE INVENTION

This description provides exemplary embodiments only, and is not intended to limit the scope, applicability or configuration of the invention. Rather, the ensuing description of the embodiments will provide those skilled in the art with an enabling description for implementing embodiments of the invention. Various changes may be made in the function and arrangement of elements without departing from the spirit and scope of the invention as set forth in the appended claims.

Thus, various embodiments may omit, substitute, or add various procedures or components as appropriate. For instance, it should be appreciated that in alternative embodiments, the methods may be performed in an order different than that described, and that various steps may be added, omitted or combined. Also, features described with respect to certain embodiments may be combined in various other embodiments. Different aspects and elements of the embodiments may be combined in a similar manner.

It should also be appreciated that the following systems, devices and methods may be components of a larger system, wherein other procedures may take precedence over or otherwise modify their application. Also, a number of steps may be required before, after, or concurrently with the following embodiments.

Figure 1:
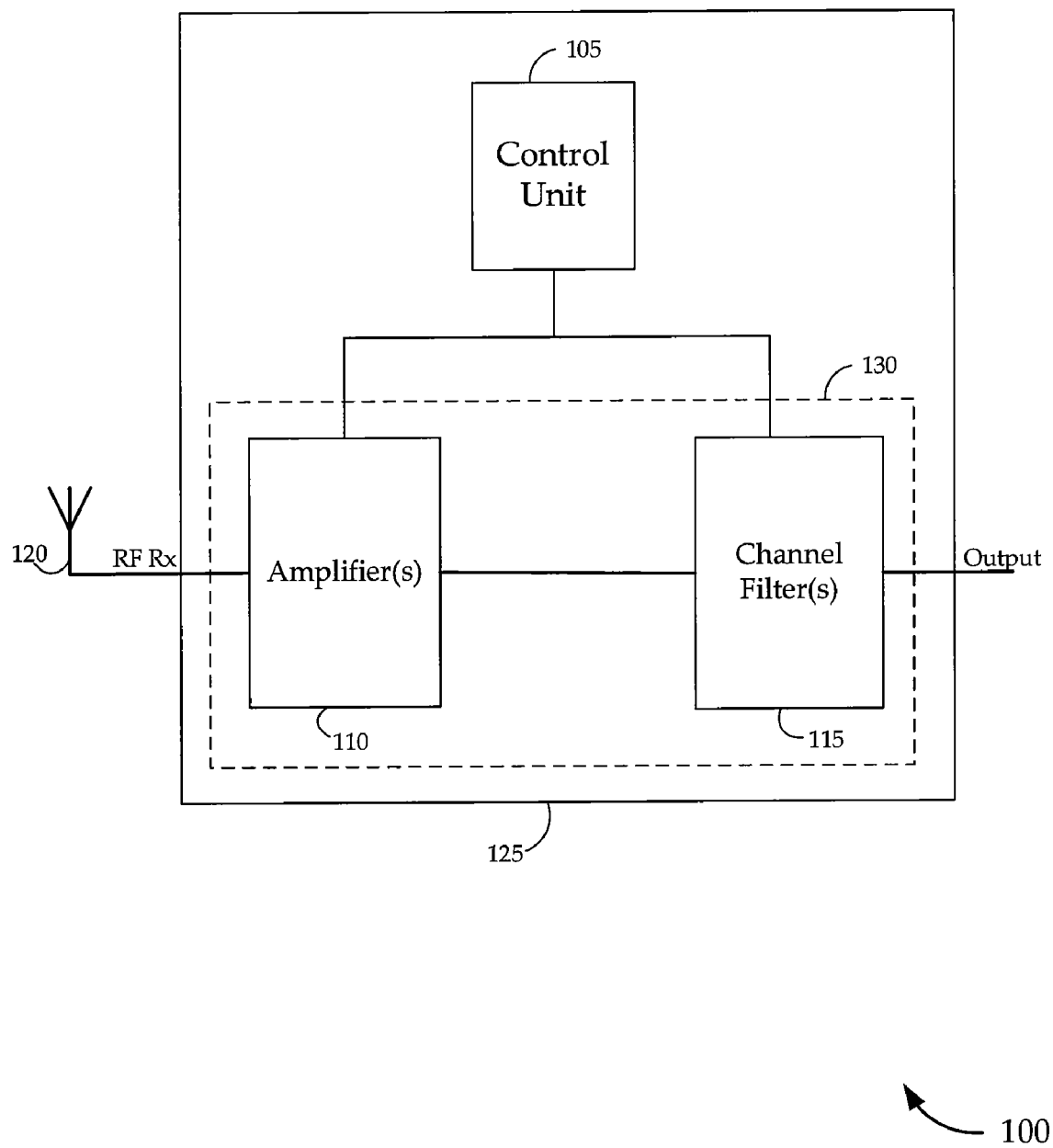
FIG. 1 is a simplified block diagram illustrating a configurable receiver according to various embodiments of the present invention.

Various methods and devices are described for adjusting an operating mode of a configurable receiver based at least in part on a selected communication service to be provided and an available signal quality. FIG. 1 is a simplified block diagram 100 illustrating an exemplary embodiment of the invention, comprising an apparatus for modifying the operational mode of a receiver. In this embodiment, the apparatus comprises a communication device 125, such as a cell phone, PDA, mobile device, or other portable or stationary user device configured to receive communication signals.

The communication device 125 includes a control unit 105, which receives data related to one or more selected communication services to be provided. The control unit 125 may be further configured to receive signal quality metrics and data relating to environmental operating conditions, as well. A control unit, as that term is used generally herein, may comprise an Application Specific Integrated Circuit (ASIC), or a general purpose processor adapted to perform the applicable functions. Alternatively, the control unit may comprise one or more other processing units (or cores), on one or more integrated circuits. In other embodiments, other types of integrated circuits may be used for the control unit 105 (e.g., Structured/Platform ASICs, Field Programmable Gate Arrays (FPGAs), and other Semi-Custom ICs), which may be programmed in any manner known in the art. A control unit 105 may be programmed to access one or more memories to fetch instructions or other data, or write data thereto. The control unit 105, in some embodiments, further comprises a digital baseband processor. Additionally, the control unit 105 may be implemented in software, or some combination of software and one or more processors.

In this exemplary embodiment, electromagnetic waves comprising a wireless signal are received by the configurable receiver 130 via a multi-band antenna 120. In other embodiments, there may be a duplexer (not pictured) configured to provide signal isolation, as well as to couple received signals to the receiver 130, and couple transmit signals from a transmit signal path to the antenna 120. The control unit 105 is configured to transmit control signals adjusting the operating mode of the configurable receiver 130. In this embodiment, the configurable receiver 130 includes one or more amplifiers 110 and one or more channel filters 115.

The amplifiers 110 may include, for example, one or more low noise amplifiers (LNAs), post mixer amplifiers (PMAs), variable gain amplifiers (VGAs), or other types and designs of amplifiers known in the art. In some cases, the amplifier may be a digital gain or multiplier. Some amplifiers 110 may be coupled in parallel, and amplifiers 110 may also be coupled in a serial fashion in a receiver chain. The control unit 105 controls the amount of gain in one or more of the amplifiers 110. There may be two, or more, gain levels (including, for example, an inactive state) for each of the amplifiers controlled by the control unit 105. Moreover, each of the controlled amplifiers may be controlled individually, in predefined groups, or as a single block. Thus, one control signal may control the gain in more than one amplifier (i.e., so that the gain in one amplifier is coordinated with the gain in a second, and that they move together).

In addition to controlling the amplifiers 110, the control unit 105 also controls one or more channel filters 115. In this embodiment, the channel filters 115 comprise one or more tunable (or otherwise programmable) filters that can, for example, be controlled with the application of a control voltage from the control unit. The channel filters may comprise one or more low-pass, high-pass, band-pass, or band-stop filters, or any combination thereof. Undesired signal components outside of the desired signal band are removed or otherwise attenuated. The control unit 105 controls the channel bandwidth (i.e., one or more corner frequencies) of one or more of these filters. There may be two, or more, channel bandwidth settings for each of the filters controlled by the control unit 105. Moreover, each of the controlled filters may be controlled individually, in predefined groups, or as a single block (i.e., one control signal may control the corner frequency in more than one filter, so that the corner frequency in one filter is coordinated with the corner frequency in a second, and that they move together to provide a composite filtering response). The channel filter, or parts thereof, may be implemented as analog or digital filters, e.g. finite impulse response ("FIR") or infinite impulse response ("IIR") filters. The amplifiers 110 and channel filters 115 may comprise discrete circuits, or may be included on a single chip.

As noted above, the control unit 105 receives information about a communication service to be provided by the communication device 125 (e.g., voice, text messaging, low-speed data, high-speed data, video, etc.). The communication service to be provided is analyzed by the control unit, and comprises a factor used by the control unit 105 to determine the operating mode of the configurable receiver 130. For example, in a very high-data rate application, the channel bandwidth would be widened to lessen the distortion of the signal. Also, amplifiers would be controlled to provide better SNR with high gain (e.g., select LNA to provide large portion of overall gain, and operate in a high gain mode). The control unit 105 may, thus, be configured to modify the receiver 130 based on the communication service to be provided. Different communication services may have different preset configurations (i.e., modes), or there may be any number of different adjustment levels.

Also, as noted above, the control unit 105 receives signal quality metrics and other information indicative of the environmental operating conditions for the receiver. This may include signal to noise ratio data, bit-error rate data, location based data, data comprising information from a scan of adjacent channels, or any combination thereof. These signal quality metrics and other information are analyzed by the control unit, and comprise a factor used by the control unit 105 to determine the operating mode of the configurable receiver 130. For example, in a high-speed data application operating in a high noise environment, the amplifiers may be controlled in a less distributed fashion (e.g., more gain for the LNA, less for other amplifiers later in the receive chain).

Therefore, the control unit 105 is configured to receive data related to the communication service to be provided, along with signal quality and additional environmental metrics. Based at least in part on these received inputs, the control unit 105 may modify (e.g., via control signals) the configurable receiver 130 (which, in this embodiment, comprises the amplifiers 110 and the channel filters 115). The control unit 105 may comprise a discrete integrated circuit, which is separate from the configurable receiver, or it may be integrated into the receiver circuit. The control unit 105 may also be a discrete component, and act as a serial to parallel interface ("SPI") control, wherein the control unit 105 is connected to a mode control on the receiver via a serial interface. A variety of other configurations are available, as evident to those skilled in the art.

Figure 2:
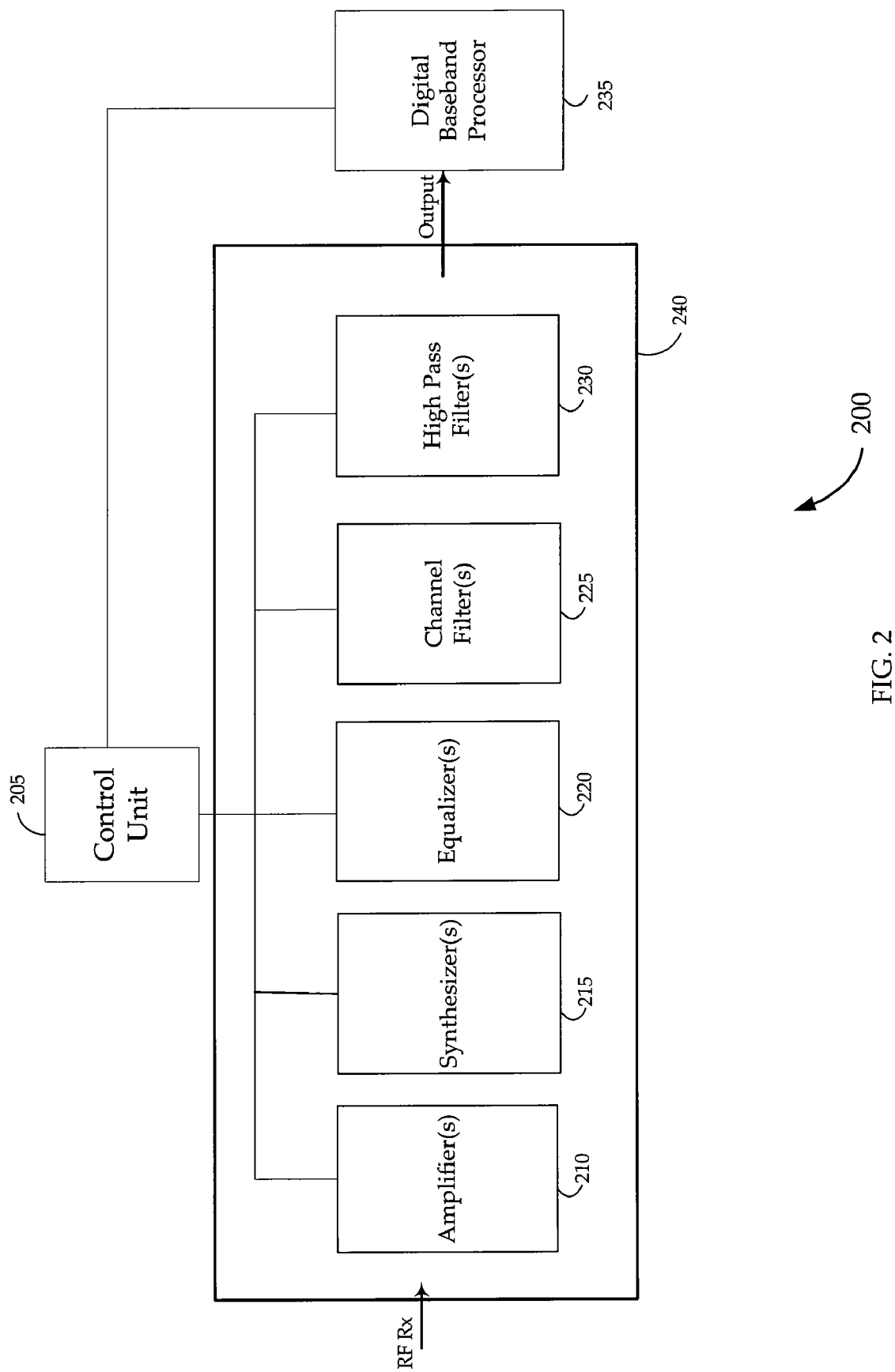
FIG. 2 is a simplified block diagram illustrating a configurable receiver and control unit configured according to various embodiments of the present invention.

FIG. 2 is an alternative exemplary embodiment of the invention, comprising a simplified block diagram illustrating an apparatus 200 configured to modify the operational mode of a receiver. In this embodiment, the control unit 205 is configured to adjust not only amplifiers 210 and channel filters 225 of the configurable receiver 240, but additionally modify one or more synthesizers 215, equalizers 220, and high-pass filters 230. While this exemplary embodiment illustrates a receiver circuit 240 with all of the aforementioned components, it should be emphasized that in other embodiments the receiver circuit need not contain each component. Moreover, while it is shown that the control unit 205 controls the configuration of each component, in other embodiments the control unit 205 may control only a subset thereof. While the control unit 205 may modify the configuration of the amplifiers 210 and channel filters 215 in the manner discussed above, further discussion is merited on the additional components.

As noted, in this embodiment, the configurable receiver includes one or more synthesizers 215. The synthesizers 215 in this embodiment are configured to be controlled at two or more settings based on a current level. The synthesizers 215 include one or more local oscillators, and operate at the desired RF carrier frequency to drive the LO ports of the mixers and thereby frequency translate an incoming signal to a lower frequency. At this frequency downconversion stage (i.e., at the mixer), the higher current synthesizer settings provide better distortion performance. In one embodiment, there are 8 synthesizer settings, but in other embodiments, there may be any other number of settings. The control unit 205 is configured to receive data related to the communication service to be provided, along with signal quality and additional environmental metrics. Based on at least a subset of this received data, the control unit 205 may modify the current pushed to the synthesizer 215. For example, in a high interference environment, more current may be pushed; while a lower amount of current may be pushed in a low interference environment in order to save power.

The configurable receiver 240, in this embodiment, also includes one or more equalizers 220. An equalizer 220 measures certain variations between a processed signal and the ideal case (i.e., measures distortion), and applies an inverse function of this measured variation to produce an equalized signal. Alternatively, an equalizer 220 may be designed to remove a systematic distortion, e.g. that caused by a known baseband filter response. Although in typical applications there may be only two settings (i.e., on or off), in other embodiments there may be additional settings with different levels of signal processing (thus, expending differing amounts of current). Based on at least a subset of the communication service and signal quality/environmental data, the control unit 205 may modify the current pushed to an equalizer 220. For example, in high-data rate applications, there may be certain very high rate thresholds where expending current for the equalizer 220 will be desirable in order to achieve certain bit-error rates. The equalizer 220 may be implemented as an analog or digital processing block.

In this embodiment, the configurable receiver 240 also includes one or more high-pass filters 230, which may comprise tunable or otherwise programmable filters. The high pass filters 230 can be implemented as analog or digital filters. The corner frequency for the high-pass filter may be adjusted by the control unit 205. Based on at least a subset of the communication service and signal quality/environmental data, the control unit 205 may modify the corner frequency for the high-pass filter 220. By way of example, there may be certain very high-data-rate applications where the corner should be adjusted to be as small as possible in order to provide the lowest distortion performance. However, there is a trade off, in that when the high-pass filter is set to a very small corner, the time constant increases. Therefore, in a voice application, with significant interference and fading issues, the corner might be opened up to lessen settling time.

The aforementioned signal processing components are, in this embodiment, included on the configurable receiver 240. There are a wide variety of different chain orders and configurations in which the components may be included. In this embodiment, the configurable receiver 240 is an analog receiver producing an analog output to a digital baseband processor 235. However, it is worth noting that in other embodiments, the receiver may include an analog to digital converter (ADC) and, thus, may output a digital signal. Moreover, one or more of the configurable elements of the configurable receiver may be implemented as digital blocks. While some embodiments of the invention are illustrated as comprising a direct conversion receiver, some embodiments may be implemented using a superheterodyne, or other, architecture.

The digital baseband processor 235 processes the received signals to recover the underlying information bits that can be used within the transceiver (e.g., to determine signal quality metrics or retrieve other data related to environmental operating conditions), or output to a user or some other device (not shown). While in this embodiment the digital baseband processor 235 and control unit 205 are pictured as discrete components, in other embodiments the control unit 205 is integrated into the digital baseband processor 235.

Figure 3:
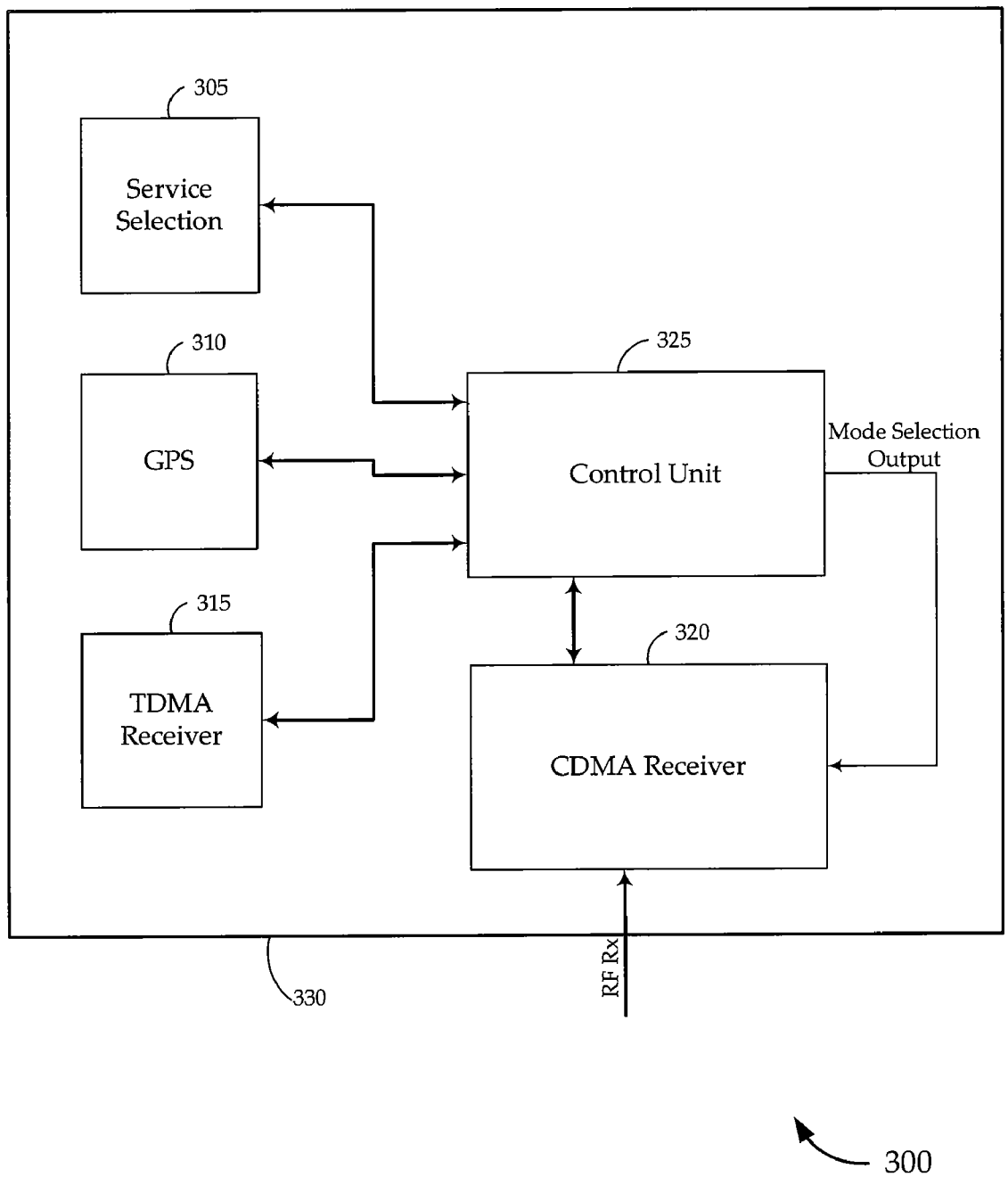
FIG. 3 is a simplified block diagram illustrating a CDMA receiver, control unit, and additional receivers configured according to various embodiments of the present invention.

Turning to FIG. 3, a simplified block diagram 300 is shown illustrating another exemplary embodiment of the invention. This embodiment illustrates a variety of examples showing how the control unit 325 of a communication device 330 may receive the data related to the communication service to be provided, along with signal quality and additional environmental metrics.

A service selection block 305 comprises any data source transmitting a communication service selection to the control unit 325. For example, the source may comprise a component reflecting a user selection, via a device interface, to receive an incoming call, download an email, activate a high-speed data service, etc. Alternatively, the source may comprise a component receiving a control signal or other indictor from a carrier that it will be initiating a selected communication service. Thus, the service selection block 305 may comprise a circuit or other component transmitting a signal or other indicator of a communication service to be provided by a device 330. While certain embodiments discuss voice, low-speed data, high-speed data, and video as exemplary communication services, it is worth noting that there may be any number of alternative categories (e.g., high quality v. low quality voice, more granular data rate thresholds, reliability and security levels, etc.). Also, a communication service to be provided may be defined by a data rate alone (e.g., service 1: under 100 Kbps, Service 2: 100 kbps to 500 kbps; Service 3: over 500 Kbps).

A GPS receiver 310 comprises a receiver component configured to transmit a set of data identifying the location of the device 330 to the control unit 325. Although a GPS receiver 310 component is illustrated, in other embodiments the control unit 325 may be directly or indirectly coupled with any other receiver component which enables the reception of location based data. By way of example, a receiver may be an integrated component or may be a stand alone receiver otherwise communicating with the device 330. In some embodiments, hardware may be removable from the device, and then coupled with another network connected device to provide similar functionality without reconfiguration of the hardware. An example of such a component is a GPS receiver communicatively coupled with the device 330 with a USB connection. A receiver may, alternatively, comprise any other combination of hardware and software to achieve the functionality described above.

The location based data may be in the form of satellite location information, cellular location information, network analysis of location information, location information specific to a building, or other means for location determination. The location based data may be based on triangulation using cellular towers or access points. The location based data may be GPS coordinates or any other GPS related location information. Alternatively, cellular carriers may employ other means of locating cellular telephones and other mobile computing devices using cellular towers. By way of example, the time difference of arrival, angle of arrival, and location pattern matching methods are well known in the art as alternative means of obtaining location information. Additionally, any combination of the above may be used, as well.

In this exemplary embodiment, the control unit 325 is configured to process the location based data to determine the environmental operating conditions at the location. Thus, the control unit 325 may be communicatively coupled with a storage medium or storage device with a data store comprising environmental operating conditions for a number of locations (e.g., relative locations and capabilities of nearby cell towers, natural and man-made characteristics of a location that impact the propagation of wireless signals, etc.). The control unit 325 may apply the location based data to information in a data store, and modify the configuration of the receiver (in this embodiment, the CDMA receiver 320) based on the environmental operating conditions. Alternatively, note that the location based data may be transmitted to a remote server for processing, wherein the server would transmit environmental operating conditions data back to the device.

In this embodiment, assume that the CDMA receiver 320 is the configurable receiver being configured by the control unit 325. The TDMA receiver 315 in this embodiment may, nonetheless, be used to scan adjacent channels to produce adjacent channel data. The TDMA receiver 315 transmits the adjacent channel data to the control unit 325, which may process and analyze the data to assess the level of interference for the channel. The control unit 325 may then use this channel interference information to configure the CDMA accordingly, in light of the communication service to be provided, along with other signal quality/environmental metrics. Although a TDMA receiver is illustrated in this embodiment, other embodiments may include an alternative receiver using other protocols. Also, the interference may be inferred by interfrequency scans performed by the CDMA receiver 320 as part of normal operation.

As noted, in this embodiment, the CDMA receiver 320 is the configurable receiver being configured by the control unit 325. However, the signal received by the CDMA receiver 320 may be processed by the control unit 325 to determine any number of signal quality metrics. For example, the signal quality metrics measured may comprise a signal to noise ratio (SNR), bit-error rate (BER), signal-to-noise-and-distortion ratio (SINAD), effective number of bits (ENOB), total harmonic distortion (THD), total harmonic distortion plus noise (THD+N), or any other measure of signal quality known in the art. The control unit 325 receives each of these inputs, and outputs a mode selection (or otherwise modifies the configuration of the CDMA receiver 320 chain) based at least in part on one or more of these inputs.

Figure 4:
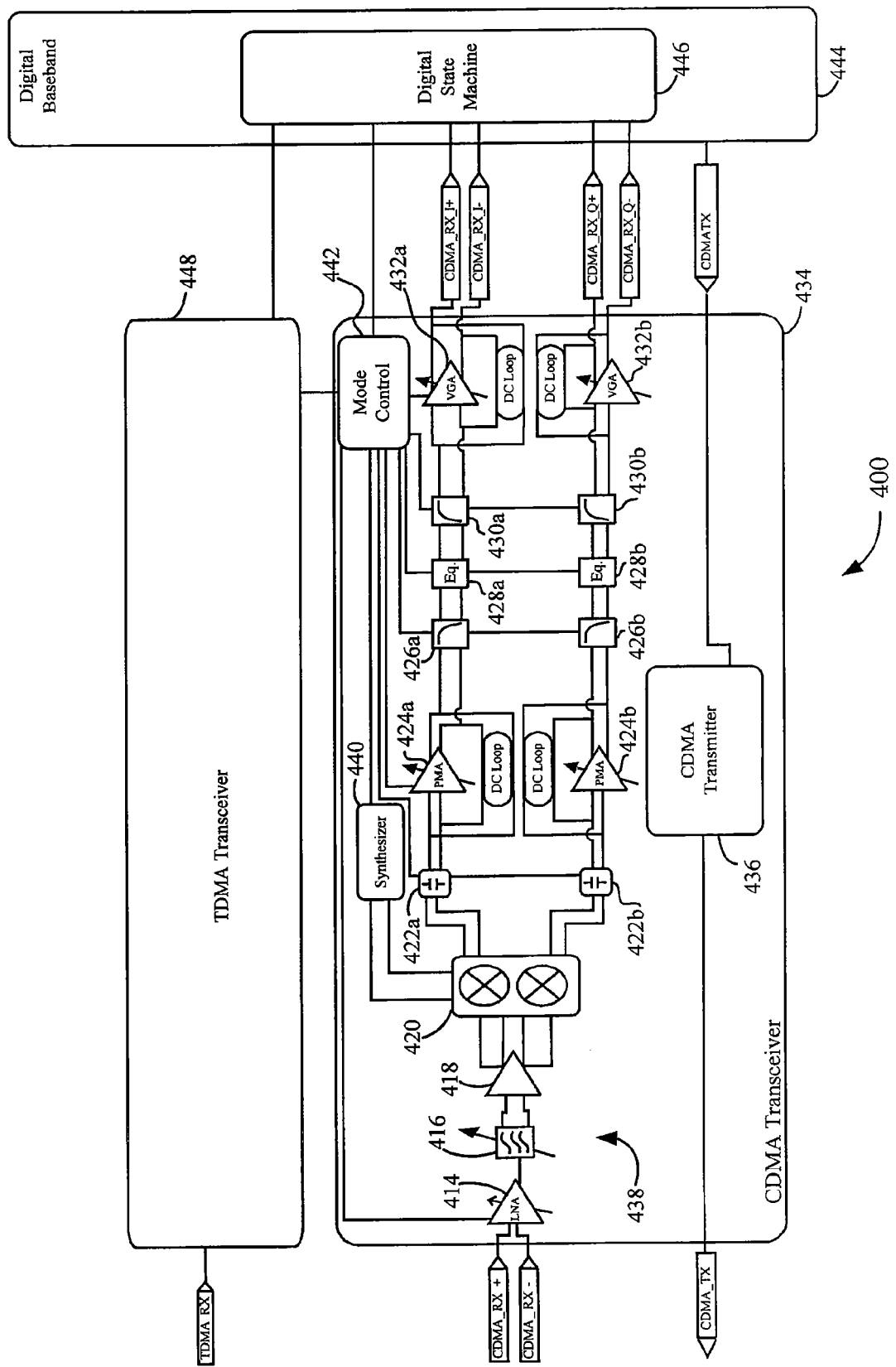
FIG. 4 is a simplified block diagram illustrating a CDMA transceiver and a TDMA transceiver configured according to various embodiments of the present invention.

FIG. 4 is a simplified functional block diagram of an exemplary embodiment illustrating a multimode apparatus 400. The multimode apparatus includes a CDMA transceiver 434, configured in accordance with various embodiments of the invention. The apparatus also includes a TDMA transceiver 448 and digital baseband processor 444 coupled with the CDMA transceiver 434. In this embodiment, the CDMA transceiver 434, TDMA transceiver 448 and digital baseband processor 444 each comprise separate integrated circuits. However, the multimode apparatus 400 may be implemented in a single semiconductor substrate of a single IC. In other embodiments, the multimode apparatus 400 may be implemented in an alternative chip set configuration, a combination of one or more ICs and external elements, a combination of other elements, etc.

In this embodiment, a digital state machine 446 comprises the control unit, and is located in the digital baseband processor. As noted previously, however, the control unit may be implemented as a stand alone IC, or integrated into the configurable transceiver (in this case, the CDMA transceiver 434), or elsewhere. The digital state machine 446 is coupled with a mode control 442, configured to implement the adjustments or modifications in the CDMA receiver chain 438 directed by the state machine 446. In this embodiment, the state machine 446 is connected to a mode control 442 via a serial interface. The state machine 446, in some embodiments, performs serial writes to registers of the mode control 442 to configure individual components of the receiver chain 438. However, as will be discussed later, the mode control 442 may be configured to control a limited number of operation states (e.g., 5 states), which would limit the traffic between the state machine 446 and the mode control 442. A number of variations are possible (i.e., limited states for some component groups, low level register control of other components), as evident to those skilled in the art.

Turning to the signal processing chain, CDMA signals are received, for example, from an antenna (not pictured) coupled to an LNA 414. The gain for the LNA 414 may be controlled by the state machine 446, via the mode control 442. In some embodiments, the LNA 414 would be limited to two states, while in others there may be any number of levels of granularity. The LNA 414, at the front end of the receiver chain, may be configured to provide excellent gain, with lower noise performance; however, with an increase in gain of these signals, the interference component of the signals is amplified, as well. Thus, while this interference can present problems, further assessment of the SNR and the interference levels of the signal may be worthwhile. Thus, a high-speed data application may still have a relatively higher level of LNA gain if the interference levels are low enough. In many instances, therefore, the LNA 414 may be utilized to provide the best gain with the lowest noise, however this is often subject to an assessment of the interference environment. In higher interference environments, some of the gain may be shifted to amplifiers further along in the receiver chain.

In this embodiment, the signals are then processed by a filter 416 and another amplifier 418, which are not configured to be controlled by the mode control 442 (in other embodiments, however, either could be tunable). The filter 416 is coupled to the I and Q mixers 420 that operate to frequency downconvert the signals to baseband I and Q signals. A frequency synthesizer 440 includes one or more local oscillators, and operates at the desired RF carrier frequency to drive the LO ports of the mixers 420 and thereby frequency translate I and Q signals to the lower baseband frequencies. The synthesizer 440 is controlled by the state machine 446, via the mode control 442. For the mixers 420, higher current synthesizer settings will provide a better distortion reduction. In this embodiment, there are 8 synthesizer settings but, in other embodiments, there may any other number of settings. In a high interference environment, therefore, more current might be called for. However, in certain low interference environments, the extra current required to decrease distortion may not be necessary. The synthesizer may be configured for better in band noise performance, and also better far out noise performance (e.g., for some high interference environments).

The downconverted I and Q signals are then processed by a set of simple low-pass pole filters 422a, 422b. These filters are part of an overall filter response for the baseband, as these poles are, in effect, tied to the low-pass filters 426a, 426b that come later in the receiver chain. Together, these sets of filters 422, 426 move together as a block to produce a composite filter response. The corner frequency produced by this composite filter response may be controlled by the state machine 446, via the mode control 442. For high-data rate applications in high interference environments, more selectivity (i.e., opening the corner frequency) may be called for with these filters 422, 426 in order to prevent issues due to interference. The tradeoff is that the filtering also distorts the desired signals to be received, but this issue may be compensated for with additional signal processing.

The I and Q signals are also processed (between the filter stages described above) by post mixer amplifiers (PMAs) 424a, 424b, which comprise a set of amplifiers which are variably controlled by the state machine 446. The decision process for the gain control of the PMAs 424 is aligned with the LNA 414 process. Thus, where there is need for a reduction in interference levels, gain which typically may occur at the LNA 414 may be shifted to the PMAs 424, although this shift may come at the expense of the SNR.

After the low-pass filtering stages are completed, the I and Q signals are processed by a set of equalizers 428a, 428b. The equalizer 428 is controlled by the state machine 446, measures certain signal distortions, and applies inverse functions of these measured variations to produce an equalized signal. Alternatively, the equalizer may be preset to compensate for known distortions in other processing elements. The tradeoff in this case is that current is expended to use the equalizer 428. However, using the equalizer 428 improves BER performance, and lowers certain distortion. Unlike other components, the equalizer provides such benefits without amplifying the interference effects and, thus, use of the equalizer may be called for in moderate- and high-data rate applications which require better BER performance.

The I and Q signals are then processed by a set of high-pass filters 430a, 430b, which may comprise tunable or otherwise programmable filters. The corner frequency for the high-pass filters 430 may be adjusted by control signals from the state machine 446. In certain high-data rate applications, it may be desirable to set a very small corner, improving distortion performance. However, a tradeoff is that the time constant increases, lengthening settling time and the high-pass filter. A set of final amplifiers, VGAs 432a, 432b, process the signal after it has passed through the high-pass filters 430. Again, as with the PMAs 428 discussed above, in higher interference environments the state machine may be configured to shift the gain from the LNA 414 to the VGAs 432 to improve interference rejection.

The I and Q signals are then output in analog form to the digital baseband processor 444. The digital baseband processor includes an analog to digital converter (ADC). The digital baseband processor 444 processes the received signals to recover the underlying information bits that can be used by the state machine 446 (e.g., to determine signal quality metrics or retrieve other data related to environmental operating conditions), or output to a user or some other device (not shown). The digital baseband processor may also output an analog CDMA signal to be processed and transmitted by a CDMA transmitter 436. While in this embodiment, the digital baseband processor 444 and state machine 446 are a single integrated circuit, in other embodiments the control unit is separate from the digital baseband processor 444.

As noted, in the embodiment described above, the I and Q signals are output in analog form to the digital baseband processor 444. However, in other embodiments, the analog I and Q signals may be converted to digital signals earlier in the receiver chain (e.g., with an analog to digital converter, hereinafter "ADC"). Such an embodiment may involve converting the analog signals to digital signals, and then utilizing configurable digital stages. For example, the ADC may be placed between the PMAs 424 and low pass filters 426, with the remaining processing stages in the receiver chain being digital. Other embodiments may include any number of alternative configurations, as is evident to one skilled in the art.

It is also worth noting that while in this embodiment the mode control 442 modifies the configuration of the transceiver in which it is located, the mode control 442 may also control the configuration of the TDMA receiver (i.e., the mode control 442 may control an off chip receiver, and may control more than one receiver). Also, in this embodiment, it is worth noting that the modification to the configuration of the receiver does not modify the receive path of the signal. Both before and after the reconfiguration, the receive path through the receiver for the various components of the signal may remain the same. Thus, a device may receive the different services on the same set of receive paths in a single receiver chain.

As noted above, the mode control 442 may be configured to control a limited number of preselected operational states (e.g., 5 states, 10 states). There may be certain advantages to having a number of predefined states that may be selected based, for example, on data rate (i.e., the communication service to be provided) and certain signal quality/environmental metrics. Limiting the states may reduce the traffic between the state machine 446 and the mode control 442. The digital state machine 446 may be configured to identify the proper state, and transmit the selection to the mode control 442. There are a variety of ways that the predefined states (or modes) may be defined, wherein different combinations of the inputs described above may result in a finite number of states. However, for purposes of illustration, Table 1 illustrates an exemplary set of configuration states.

TABLE 1

State 1 - Standard condition for voice and lower data rates (Compliant to basic standard)

Figure 5:
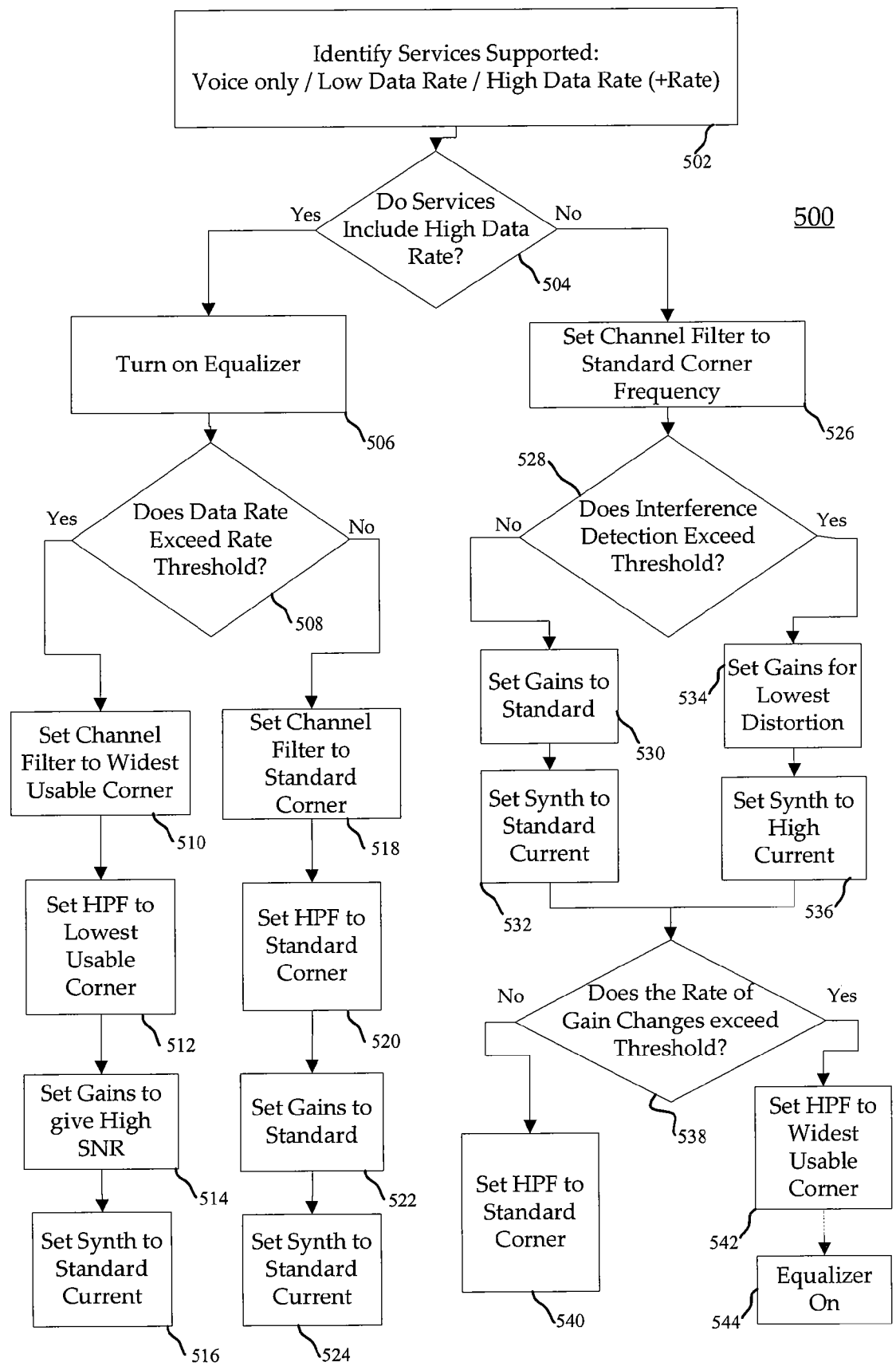
FIG. 5 is a simplified flow diagram for a digital state machine configured according to various embodiments of the present invention.

Channel filter set to standard corner frequency
High-pass filter set to standard corner frequency
Equalizer off
Gain control set for standard interference rejection
Synthesizer set for standard performance
State 2 - Best interference rejection for voice and lower data rates Channel filter set to standard corner frequency
High-pass filter set to standard corner frequency
Equalizer off
Gain control set for best interference rejection (choose to lessen gain in the LNA and replace the gain in either the PMA or the VGA later in the chain)
Synthesizer set for lowest far out noise
State 3 - Rapidly fading signal for voice and lower data rates Channel filter set to standard corner frequency
High-pass filter set to medium corner frequency (accept some degradation of BER in exchange for faster settling)
Equalizer on
Gain control set for standard interference rejection
Synthesizer set for standard performance
State 4 - Modest data rate packets Channel filter set to standard corner frequency
High-pass filter set to standard corner frequency
Equalizer on
Gain control set for standard interference rejection
Synthesizer set for standard performance
State 5 - High-data rate packets Channel filter set to high corner frequency (choose lowest group delay distortion but less selectivity to interference)
High-pass filter set to lowest corner frequency
Equalizer on
Gain control set for best signal to noise (choose to have low noise amplifier in high gain mode)
Synthesizer set for lowest in band noise peformance While Table 1 illustrates an example of a set of predefined states for a reconfigurable receiver, it is also worthwhile to discuss the manner in which such a system may be implemented. FIG. 5 represents an exemplary flow diagram 500 representing a logical flow that may, for example, comprise the process undertaken by a control unit (such as a digital state machine) in selecting one of a set of predefined configurations for the receiver. Such a control unit may comprise one or more of the processors described above, and may be configured in any manner known in the art. The amplifiers, channel filters, equalizers, high-pass filters, and synthesizers discussed in relation to FIG. 5 may comprise the receiver components discussed above in various embodiments, although many other configurations will be evident to those skilled in the art, as well.

At block 502 of FIG. 5, the communication service to be provided is identified: i.e., voice only/low-data rate/high-data rate. At decision block 504, a determination is made whether such services include high-data rate services (e.g., above a specified data rate). If so, at block 506, a two-state (on/off) equalizer is activated. At decision block 508, a determination is made whether the data rate exceeds an even higher data rate threshold. If so, the baseband channel filter is set to the widest usable corner at block 510, while a high-pass filter (hereinafter "HPF") is set to the lowest usable corner at block 512. At block 514, amplifier gains are set to provide a high SNR (perhaps by configuring an LNA to provide a greater proportion of the gain). At block 516, the synthesizer is set to a standard setting (e.g., mid-range, or default) current setting. For purposes of discussion, a "standard" setting for a receiver component comprises the default setting, which typically falls within the middle of a range of settings available.

Returning to decision block 508, assume instead that the data rate does not exceed the higher data rate threshold. At block 518, the baseband channel filter is set to a standard corner frequency, while the HPF is set to a standard corner frequency at block 520. The standard gain distribution is specified at block 522. At block 524, the synthesizer is set to a standard current setting, as well.

Returning to decision block 504, assume instead that the services do not include high-data rate service. The baseband channel filter is set, at block 526, to a standard corner frequency. At block 528, a determination is made whether the interference detected exceeds a specified threshold. If not, the standard gain and synthesizer settings are selected at blocks 530 and 532. However, if an interference threshold is exceeded, the amplifiers are configured for lowest distortion at block 534, while the synthesizer is set to a high current setting at block 536.

Regardless of the prong off of decision block 528, the logical flow returns to decision block 538, where a determination is made whether the rate of gain changes exceed a certain threshold. If not, at block 540, the HPF is set to a standard corner frequency. However, in more dynamic environments where the threshold is exceeded, the HPF is set to the widest usable corner at block 542, and the equalizer is activated at block 544. It should be emphasized that the flow diagram of FIG. 5 represents only an exemplary embodiment, and that there are significant variations in the various embodiments which may be implemented.

Figure 6:
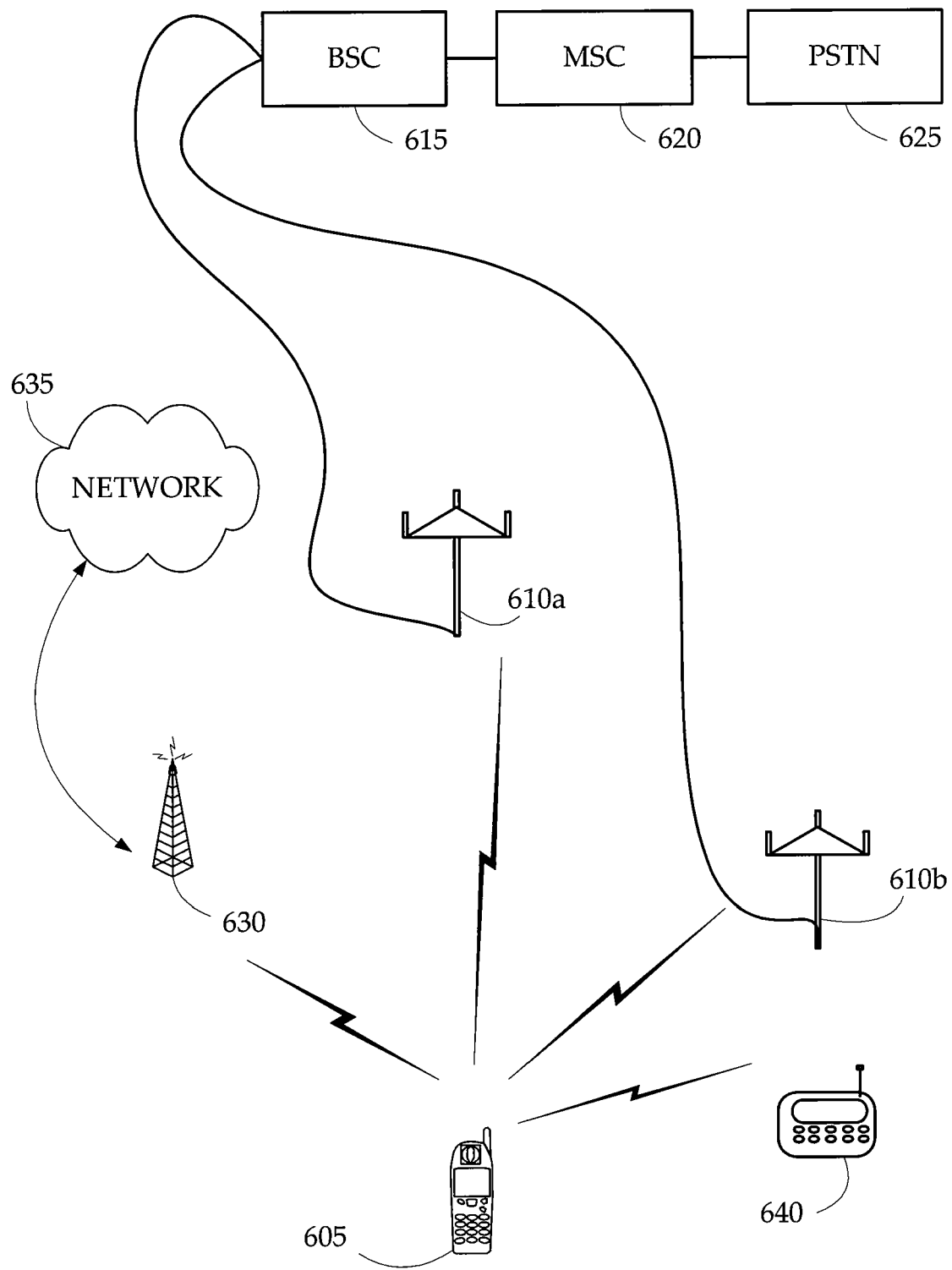
FIG. 6 illustrates an system diagram illustrating an exemplary operating environment for a configurable receiver according to various embodiments of the present invention.

FIG. 6 illustrates an exemplary system 600 within which various embodiments of the invention may operate. A user device 605, which includes a receiver configured according various embodiments described above, is configured to communicate with one or more communication systems, which may include a wireless telephone system, such as a CDMA system. The user device 605 communicates with one or more base stations 610*a* and 610*b*, which are coupled to one or more base station controllers 615. In this exemplary embodiment, two base stations 610*a* and 610*b* are shown coupled to the same base station controller 615, although such a configuration is not a requirement. The base station controller 615 is coupled to a mobile station controller 620 which, in turn, is coupled to a public switched telephone network (PSTN) 625. This communication system is a two way communication system and the user device 605 can be configured to both transmit and receive information to and from the system. Each base station 610*a* and 610*b* can support a corresponding coverage area, that can be distinct or overlapping.

The user device 600 is not limited to communication with one communication subsystem and, thus, may communicate with two or more communication subsystems. For example, the first communication subsystem may be configured to provide wireless communications via a Time Division Multiple Access (TDMA) communication protocol in a first operating bandwidth, such as Global Systems for Mobile communication (GSM). The second communication subsystem may be configured to provide wireless communications via a Code Division Multiple Access (CDMA) communication protocol in a second operating bandwidth, such as Wideband CDMA (WCDMA). The first and second operating bandwidths can be distinct or can be overlapping. Additionally, each communication subsystem is not limited to either TDMA or CDMA, but may be any particular communication protocol. Similarly, although the examples of the communication subsystems have been of wireless telephone communication subsystems, the communication system 100 is not limited to wireless telephone communication subsystems.

The user device 605 may also be configured to communicate with a WLAN system (either as an additional subsystem, or as the only subsystem). The WLAN system may include one or more access points 630 coupled to a network 635. The network 635 can be any type of communication network, such as a LAN, or the Internet. The user device 605 may be configured to communicate with the WLAN using a different communication protocol than in a first communication subsystem. For example, a second communication system may be an IEEE 802.11 WLAN, and the user device 605 can be configured to communicate with the system according to the IEEE 802.11 standard.

The user device 605 may also be configured to communicate with other communication systems, which may be a Personal Area Network, such as a Bluetooth network. As with the WLAN, the PAN may comprise an additional subsystem, or the only subsystem. The user device 605 may be configured to communicate directly with a Bluetooth enabled device 640. For example, the user device 100 may be configured to receive communications from other like configured devices using the Bluetooth communication protocol. Other Bluetooth enabled devices can include kiosks, personal digital assistants, or wireless headsets.

The user terminal 605 may, therefore, be configured to support multiple communication subsystems, each of which may communicate using one or more distinct communication protocols. The user terminal 605 may need to reconfigure communication protocols and radio frequencies depending on the configuration of the communication subsystems. The user terminal 605 may be configured to select the communication protocol corresponding to the communication subsystem with which it desires communication, and may have a preferred hierarchy of communication subsystems. The user terminal 605 may attempt to communicate using the first communication subsystem and, if it is unsuccessful, may then attempt to communicate using the second communication subsystem. In certain exemplary embodiments, the control unit reconfigures a receiver chain serving a single protocol (e.g., CDMA) depending on the communication service to be provided and certain signal quality metrics. However, a single receiver chain may be configured to serve more than one protocol. The controlled reconfiguration described above is not limited to CDMA, or any specific wireless protocol, and may instead be applied to any of the applicable protocols described above.

Figure 7A:
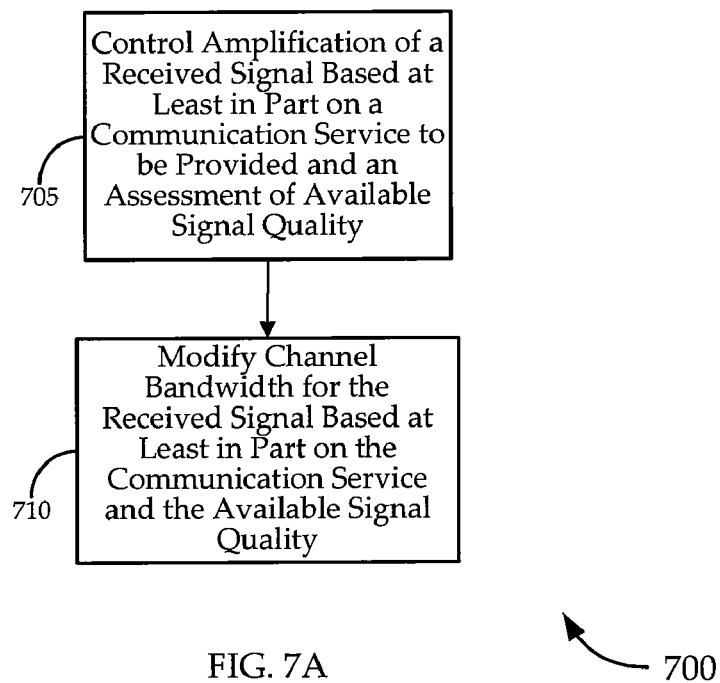
FIG. 7A illustrates a method for dynamically controlling signal processing in a configurable receiver according to various embodiments of the present invention.

FIG. 7A sets forth an exemplary embodiment 700 of the invention, illustrating a method of modifying the signal processing of a received signal. At block 705, the gain of a received signal is controlled based at least in part on a communication service to be provided and an assessment of available signal quality. At block 710, channel bandwidth is modified for a received signal based at least in part on the communication service and the available signal quality.

Figure 7B:
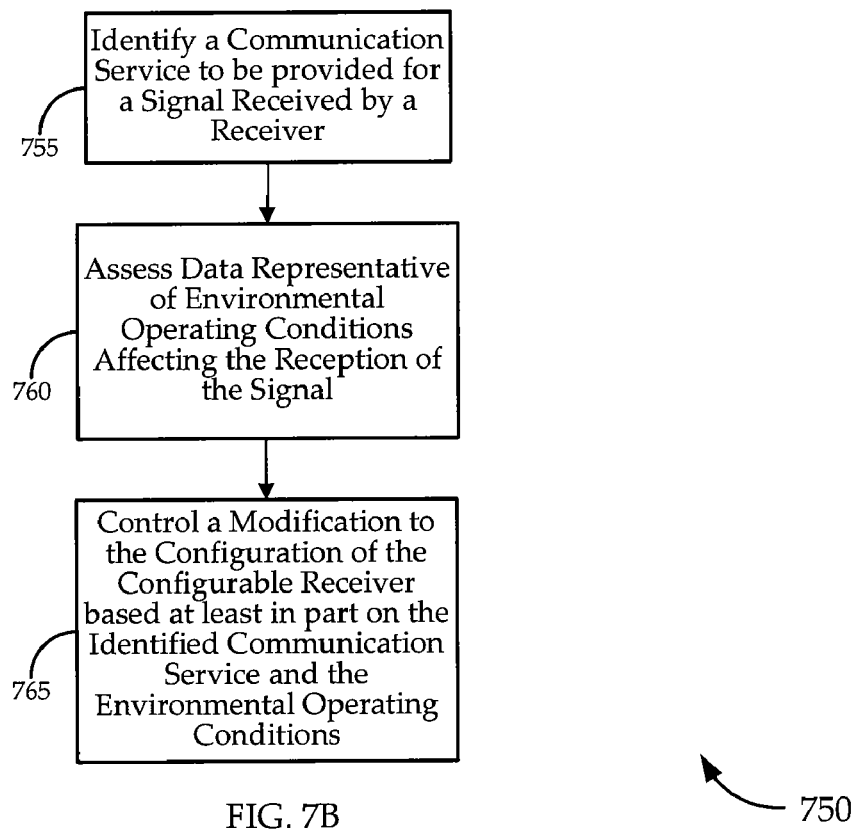
FIG. 7B illustrates a method for dynamically controlling a configurable receiver according to various embodiments of the present invention.

FIG. 7B sets forth an additional exemplary embodiment 750 of the invention, illustrating a method of determining a modification to the configuration of a configurable receiver. At block 755, a communication service to be provided for a received signal is identified. At block 760, data representative of environmental operating conditions affecting the reception of the signal is assessed. At block 765, a modification to the configuration of the configurable receiver is controlled based at least in part on the identified communication service and the environmental operating conditions.

Figure 8:
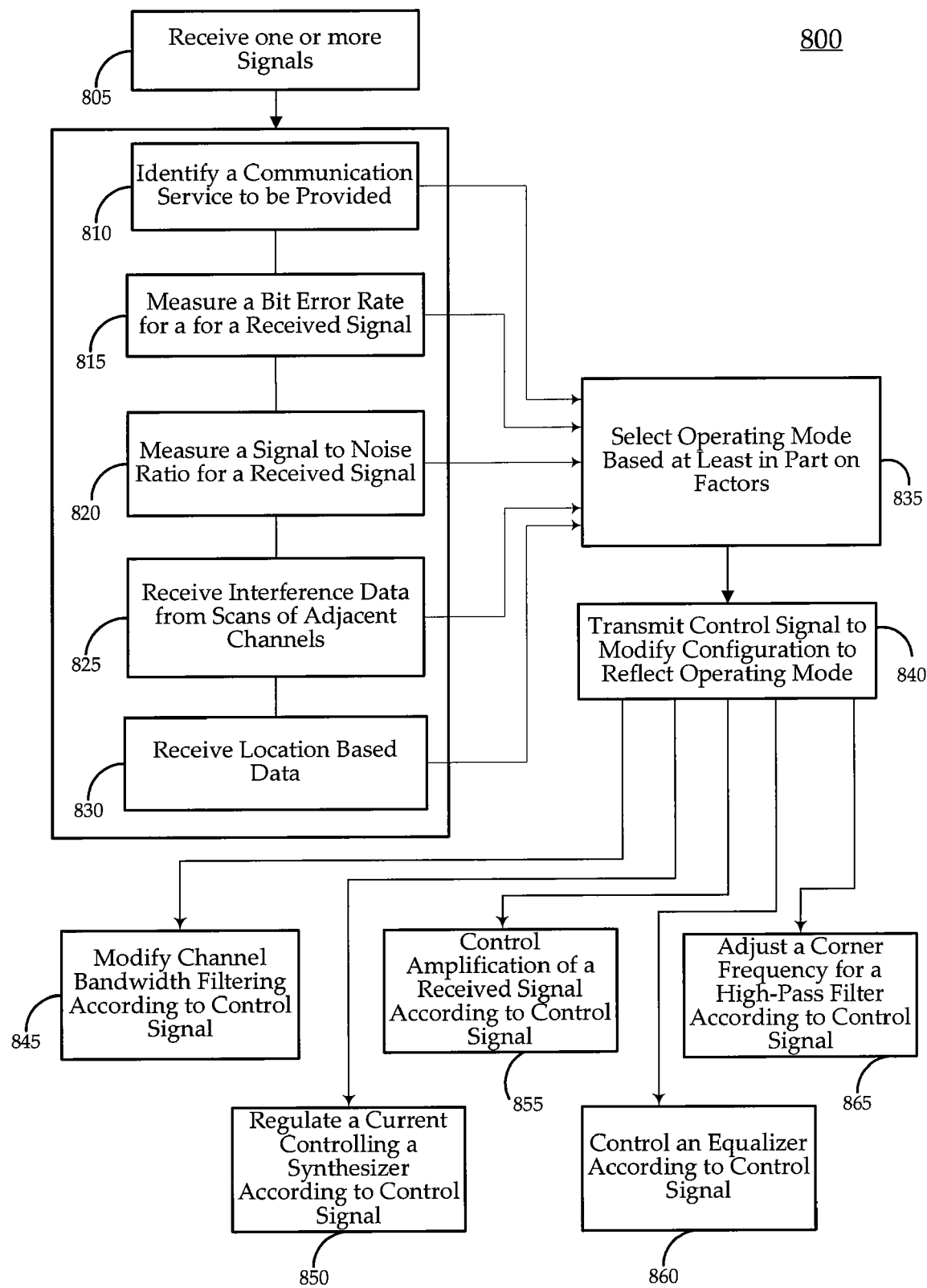
FIG. 8 illustrates an alternative method for dynamically controlling signal processing in a configurable receiver according to various embodiments of the present invention.

FIG. 8 sets forth an final exemplary embodiment 800 of the invention, illustrating a method of processing a number of inputs to produce an output controlling the modification to the configuration of a receiver. At block 805, one or more signals are received. At blocks 810-830, a number of inputs are received or otherwise measured. At block 810, a communication service to be provided is identified. A bit-error rate and signal to noise ratio for a received signal are received or otherwise measured at blocks 815 and 820. At block 825, interference data from scans of adjacent channels are received. At block 830, location based data is received.

At block 835, and based at least in part on the inputs received at blocks 810-830, an operating mode for the configurable receiver is selected. At block 840, a control signal is transmitted to modify the configuration of the receiver to reflect the selected operating mode. At block 845, channel bandwidth filtering is tuned or otherwise modified in accordance with the control signal. At block 850, current controlling a synthesizer is regulated in accordance with the control signal. At block 855, the gain of a received signal is modified as dictated by the control signal. An equalizer is controlled in accordance with the control signal at block 860, and a corner frequency for a high-pass filter is adjusted at block 865, according to the control signal.

It should be noted that the methods, systems and devices discussed above are intended merely to be exemplary in nature. It must be stressed that various embodiments may omit, substitute, or add various procedures or components as appropriate. For instance, it should be appreciated that in alternative embodiments, the methods may be performed in an order different than that described, and that various steps may be added, omitted or combined. Also, features described with respect to certain embodiments may be combined in various other embodiments. Different aspects and elements of the embodiments may be combined in a similar manner. Also, it should be emphasized that technology evolves and, thus, many of the elements are exemplary in nature and should not be interpreted to limit the scope of the invention.

Specific details are given in the description to provide a thorough understanding of the embodiments. However, it will be understood by one of ordinary skill in the art that the embodiments may be practiced without these specific details. For example, well-known circuits, processes, algorithms, structures, and techniques have been shown without unnecessary detail in order to avoid obscuring the embodiments.

Also, it is noted that the embodiments may be described as a process which is depicted as a flow chart, a flow diagram, a data flow diagram, a structure diagram, or a block diagram. Although a flow chart may describe the operations as a sequential process, many of the operations can be performed in parallel or concurrently. In addition, the order of the operations may be re-arranged. A process is terminated when its operations are completed, but could have additional steps not included in the figure.

Moreover, as disclosed herein, the terms "storage medium" or "storage device" may represent one or more devices for storing data, including read only memory (ROM), random access memory (RAM), magnetic RAM, core memory, magnetic disk storage mediums, optical storage mediums, flash memory devices or other computer-readable mediums for storing information. The term "computer-readable medium" includes, but is not limited to, portable or fixed storage devices, optical storage devices, wireless channels, a sim card, other smart cards, and various other mediums capable of storing, containing or carrying instructions or data.

Furthermore, certain aspects of the embodiments may be implemented by hardware, software, firmware, middleware, microcode, hardware description languages, or any combination thereof. When implemented in software, firmware, middleware or microcode, the program code or code segments to perform the necessary tasks may be stored in a machine readable medium such as a storage medium. Processors may perform the necessary tasks.

Having described several embodiments, it will be recognized by those of skill in the art that various modifications, alternative constructions, and equivalents may be used without departing from the spirit of the invention. For example, the above elements may merely be a component of a larger system, wherein other rules may take precedence over or otherwise modify the application of the invention. Also, a number of steps may be required before the above elements are considered. Accordingly, the above description should not be taken as limiting the scope of the invention, which is defined in the following claims.

What is claimed is:

1. A configurable wireless communication device, the device comprising:
   a control unit;
   a first configurable receiver being configured by the control unit, wherein signal received by the first receiver is processed by the control unit to determine a signal quality metrics;
   a service selection block comprising a data source transmitting a communication service selection to the control unit;
   a GPS receiver configured to transmit a set of data identifying a location of the communication device to the control unit, wherein the control unit is configured to process the location based data to determine an environmental operating condition at the location; and
   a second receiver for scanning adjacent channel to produce adjacent channel data and transmitting the adjacent channel data to the control unit, wherein the control unit processes and analyzes the data to assess a level of interference for the channel,
   wherein the control unit then uses the signal quality, communication service selection, environmental operating condition, and channel interference information to configure the first configurable receiver accordingly.

2. The configurable wireless communication device, as recited in claim 1, further comprising a storage medium, coupled with the control unit, with a data store comprising environmental operating condition for a number of locations.

3. The configurable wireless communication device, as recited in claim 1, wherein the signal quality metrics is selected from a group consisting of a signal to noise ratio, bit-error rate, signal-to-noise-and-distortion ratio, effective number of bits, total harmonic distortion, and total harmonic distortion plus noise.

* * * * *